US010083655B2

(12) United States Patent
Lee et al.

(10) Patent No.: US 10,083,655 B2
(45) Date of Patent: Sep. 25, 2018

(54) PIXEL, METHOD OF DRIVING THE PIXEL AND ORGANIC LIGHT-EMITTING DISPLAY DEVICE INCLUDING THE PIXEL

(71) Applicant: SAMSUNG DISPLAY CO., LTD., Yongin-si, Gyeonggi-do (KR)

(72) Inventors: Jae Hoon Lee, Yongin-si (KR); Young In Hwang, Yongin-si (KR); Ji Hye Kong, Yongin-si (KR); Jin Woo Kim, Yongin-si (KR); Do Hyung Ryu, Yongin-si (KR); Yong Sung Park, Yongin-si (KR); Jae Woo Song, Yongin-si (KR); Byung Hyuk Shin, Yongin-si (KR); Hae Goo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 15/184,901

(22) Filed: Jun. 16, 2016

(65) Prior Publication Data

US 2016/0379570 A1    Dec. 29, 2016

(30) Foreign Application Priority Data

Jun. 26, 2015  (KR) .......................... 10-2015-0091376

(51) Int. Cl.
G09G 3/32        (2016.01)
G09G 3/3233     (2016.01)
H01L 27/12       (2006.01)

(52) U.S. Cl.
CPC ... *G09G 3/3233* (2013.01); *G09G 2300/0819* (2013.01); *G09G 2300/0842* (2013.01); *G09G 2310/0262* (2013.01); *G09G 2310/08* (2013.01); *G09G 2320/0233* (2013.01); *G09G 2320/045* (2013.01); *H01L 27/124* (2013.01); *H01L 27/1225* (2013.01); *H01L 27/1255* (2013.01)

(58) Field of Classification Search
None
See application file for complete search history.

(56) References Cited

U.S. PATENT DOCUMENTS

2010/0220091 A1    9/2010  Choi
2010/0220093 A1    9/2010  Choi
(Continued)

FOREIGN PATENT DOCUMENTS

KR    10-2010-0098861 A    9/2010
KR    10-2010-0098862 A    9/2010
(Continued)

*Primary Examiner* — Joseph Haley
(74) *Attorney, Agent, or Firm* — Lewis Roca Rothgerber Christie LLP

(57) ABSTRACT

A pixel includes: a first transistor connected between a data line and a first node; a second transistor connected between a first power source and a second node, the second transistor including a gate electrode connected to the first node; a third transistor connected between the first node and a third power source; a fourth transistor connected between the second node and an fourth power source; a capacitor connected between the first node and the second node; and an organic light-emitting diode (OLED) connected between the second node and a second power source.

19 Claims, 5 Drawing Sheets

(56) References Cited

U.S. PATENT DOCUMENTS

2014/0139502 A1* 5/2014 Han .................... G09G 3/3233
                                                                                        345/212
2015/0170569 A1* 6/2015 Han .................... G09G 3/3258
                                                                                        345/78

FOREIGN PATENT DOCUMENTS

| KR | 10-1391100 B1 | 4/2014 |
| KR | 10-1470968 B1 | 12/2014 |

* cited by examiner

PIXEL, METHOD OF DRIVING THE PIXEL AND ORGANIC LIGHT-EMITTING DISPLAY DEVICE INCLUDING THE PIXEL

CROSS-REFERENCE TO RELATED APPLICATION

This application claims priority to and the benefit of Korean Patent Application No. 10-2015-0091376, filed on Jun. 26, 2015, in the Korean Intellectual Property Office, the entire content of which is incorporated herein by reference in its entirety.

BACKGROUND

1. Field

One or more aspects of example embodiments of the present invention relate to a pixel, a method of driving the pixel, and an organic light-emitting display device including the pixel.

2. Description of the Related Art

Organic light-emitting display devices display an image using organic light-emitting diodes that generate light through recombination of electrons and holes. Organic light-emitting display devices have fast response speeds and may concurrently (e.g., simultaneously) display clear images.

In general, an organic light-emitting display device includes a plurality of pixels, each including a driving transistor and an organic light-emitting diode. Each of the plurality of pixels controls an amount of current supplied to the organic light-emitting diode using the driving transistor, thereby representing a gray scale (e.g., a gray level).

The above information disclosed in this Background section is only to enhance the understanding of the background of the present invention, and therefore it may contain information that does not constitute prior art.

SUMMARY

One or more aspects of example embodiments of the present invention relate to a pixel, a method of driving the pixel, and an organic light-emitting display device including the pixel, which may improve the quality of an image and display a large-scale screen.

According to an exemplary embodiment of the present invention, a pixel includes: a first transistor connected between a data line and a first node; a second transistor connected between a first power source and a second node, the second transistor including a gate electrode connected to the first node; a third transistor connected between the first node and a third power source; a fourth transistor connected between the second node and an fourth power source; a capacitor connected between the first node and the second node; and an organic light-emitting diode (OLED) connected between the second node and a second power source.

The first transistor may include a first electrode connected to the data line, a second electrode connected to the first node, and a gate electrode connected to a second control line; the second transistor may further include a first electrode connected to the first power source, and a second electrode connected to the second node; the third transistor may include a first electrode connected to the first node, a second electrode connected to the third power source, and a gate electrode connected to a first control line; and the fourth transistor may include a first electrode connected to the second node, a second electrode connected to the fourth power source, and a gate electrode connected to a third control line.

Each of the first through fourth transistors may include an n-channel transistor.

The third transistor may be configured to be in an on state during a first period and a second period, and the fourth transistor may be configured to be in an on state during the first period.

The first transistor may be configured to be in an on state during a third period, and the fourth transistor may be further configured to be in an on state during a fourth period.

The fourth power source may be configured to be at a same voltage level as that of the second power source.

The third power source may be configured to be at a same voltage level as that of the second power source.

An active layer of each of the first through fourth transistors may include an oxide semiconductor.

According to another exemplary embodiment of the present invention, a method of driving a pixel including a first transistor, a second transistor, a third transistor, a fourth transistor, a capacitor, and an organic light-emitting diode (OLED), includes: a first initialization operation of supplying a reference voltage to a gate electrode of the second transistor by turning on the third transistor, and supplying an initialization voltage to a source electrode of the second transistor by turning on the fourth transistor; a threshold voltage compensation operation of maintaining the third transistor in an on state, and storing a threshold voltage of the second transistor in the capacitor; a data writing operation of supplying a data voltage to the gate electrode of the second transistor by turning on the first transistor; a second initialization operation of supplying the initialization voltage to the source electrode of the second transistor by turning on the fourth transistor; and an emission operation of supplying a driving current from the second transistor to the OLED corresponding to a voltage stored in the capacitor.

The first transistor may be in an off state during the first initialization operation, the threshold voltage compensation operation, the second initialization operation, and the emission operation.

The third transistor may be in an off state during the data writing operation, the second initialization operation, and the emission operation.

The fourth transistor may be in an off state during the threshold voltage compensation operation, the data writing operation, and the emission operation.

According to another exemplary embodiment of the present invention, an organic light-emitting display device includes: a plurality of pixels connected to (n+1) (where n is a natural number that is equal to or greater than 2) scan lines, m (where m is a natural number that is equal to or greater than 2) data lines, and n control lines; a scan driver configured to supply scan signals to the scan lines; a data driver configured to supply data signals to the data lines; and a control driver configured to supply control signals to the control lines, wherein one of the plurality of pixels is connected to an i-th (where i is a natural number that is equal to or less than n) scan line, an (i+1)-th scan line, an i-th control line, and a j-th (where j is a natural number that is equal to or less than m) data line, and the one pixel includes: a first transistor connected between the j-th data line and a first node, the first transistor being configured to be turned on when an i-th scan signal is supplied to the i-th scan line; a second transistor connected between a first power source and a second node, the second transistor including a gate electrode connected to the first node; a third transistor connected between the first node and a third power source, the third transistor being configured to be turned on when a control signal is supplied to the i-th control line; a fourth transistor connected between the second node and an fourth power source, the fourth transistor being configured to be turned on when an (i+1)-th scan signal is supplied to the (i+1)-th scan line; a capacitor connected between the first node and the second node; and an organic light-emitting diode (OLED) connected between the second node and a second power source.

The first transistor may include a first electrode connected to the j-th data line, a second electrode connected to the first node, and a gate electrode connected to the i-th scan line; the second transistor may further include a first electrode connected to the first power source, and a second electrode connected to the second node; the third transistor may include a first electrode connected to the first node, a second electrode connected to the third power source, and a gate electrode connected to the i-th control line; and the fourth transistor may include a first electrode connected to the second node, a second electrode connected to the fourth power source, and a gate electrode connected to the (i+1)-th scan line.

Each of the first through fourth transistors may include an n-channel transistor.

The i-th scan signal may be supplied to the i-th scan line during a first period and a fourth period, the (i+1)-th scan signal may be supplied to the (i+1)-th scan line during a second period and a fifth period, and the control signal may be supplied to the i-th control line during the second period and a third period.

The OLED may be configured to emit light during a sixth period.

The fourth power source may be configured to be at a same voltage level as that of the second power source.

The third power source may be configured to be at a same voltage level as that of the second power source.

An active layer of each of the first through fourth transistors may include an oxide semiconductor.

According to one or more embodiments of the present invention, since a driving current supplied to an OLED is determined regardless of a threshold voltage of a driving transistor, a pixel, a method of driving the pixel, and an organic light-emitting display device including the pixel can be provided to eliminate or reduce a brightness non-uniformity phenomenon caused by a difference between threshold voltages of driving transistors.

In addition, according to one or more embodiments of the present invention, a pixel, a method of driving the pixel, and an organic light-emitting display device including the pixel can be provided to display a large-scale screen.

BRIEF DESCRIPTION OF THE DRAWINGS

Example embodiments will now be described more fully hereinafter with reference to the accompanying drawings; however, the present invention may be embodied in various different forms and should not be construed as limited to the embodiments set forth herein. Rather, these embodiments are provided so that this disclosure will be thorough and complete, and will fully convey the spirit and scope of the present invention to those skilled in the art.

In the drawing figures, dimensions may be exaggerated for clarity of illustration. Like reference numerals refer to like elements throughout.

DETAILED DESCRIPTION

Figure 1:
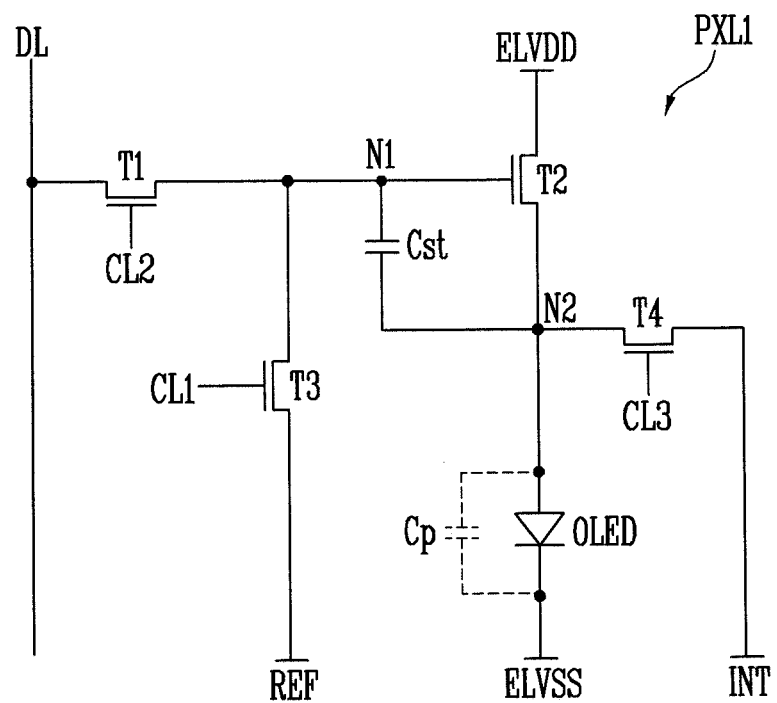
FIG. 1 illustrates a pixel according to an exemplary embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

FIG. 1 illustrates a pixel according to an exemplary embodiment of the present invention.

Referring to FIG. 1, a pixel PXL1 according to an exemplary embodiment of the present invention may include a first transistor T1, a second transistor T2, a third transistor T3, a fourth transistor T4, a capacitor Cst, and an organic light-emitting diode (OLED).

The first transistor T1 may be connected between a data line DL and a first node N1.

For example, a first electrode of the first transistor T1 may be connected to the data line DL, a second electrode of the first transistor T1 may be connected to the first node N1, and a gate electrode of the first transistor T1 may be connected to a second control line CL2.

Thus, the first transistor T1 may be turned on in response to a control signal supplied to the second control line CL2.

When the first transistor T1 is turned on, a data signal of the data line DL may be transmitted to the first node N1.

The second transistor T2 may be connected between a first power source ELVDD and a second node N2.

For example, a first electrode of the second transistor T2 may be connected to the first power source ELVDD, a second electrode of the second transistor T2 may be connected to the second node N2, and a gate electrode of the second transistor T2 may be connected to the first node N1.

The second transistor T2 may serve as a driving transistor that supplies a driving current to the OLED.

For example, the second transistor T2 may supply a driving current corresponding to a voltage stored in the capacitor Cst to the OLED.

The third transistor T3 may be connected between the first node N1 and a third power source (reference power source) REF.

For example, a first electrode of the third transistor T3 may be connected to the first node N1, a second electrode of the third transistor T3 may be connected to the reference power source REF, and a gate electrode of the third transistor T3 may be connected to a first control line CL1.

Thus, the third transistor T3 may be turned on in response to a control signal supplied to the first control line CL1.

When the third transistor T3 is turned on, a voltage of the reference power source REF may be transmitted to the first node N1.

The fourth transistor T4 may be connected between the second node N2 and an fourth power source (initialization power source) INT.

For example, a first electrode of the fourth transistor T4 may be connected to the second node N2, a second electrode of the fourth transistor T4 may be connected to the initialization power source INT, and a gate electrode of the fourth transistor T4 may be connected to a third control line CL3.

Thus, the fourth transistor T4 may be turned on in response to a control signal supplied to the third control line CL3.

When the fourth transistor T4 is turned on, a voltage of the initialization power source INT may be transmitted to the second node N2.

Here, the first electrode of each of the first through fourth transistors T1, T2, T3, and T4 may be a source electrode or a drain electrode, and the second electrode of each of the first through fourth transistors T1, T2, T3, and T4 may be a different electrode from the first electrode.

For example, when the first electrode is the drain electrode, the second electrode may be the source electrode, and when the first electrode is the source electrode, the second electrode may be the drain electrode.

Each of the first through fourth transistors T1, T2, T3, and T4 included in the pixel PXL1 may have the same channel shape.

For example, each of the first through fourth transistors T1, T2, T3, and T4 may have an n-channel shape.

Thus, each of the first through fourth transistors T1, T2, T3, and T4 may be implemented with a polycrystalline-silicon thin film transistor (poly-Si TFT), an amorphous silicon (a-Si) TFT, or an oxide TFT.

An n-channel type transistor (e.g., an n-channel transistor) may be turned off when a level of the control signal applied to a gate thereof is in a low state, and may be turned on when the level of the control signal is in a high state. In addition, an operating speed of the n-channel type transistor is higher than that of a p-channel type transistor (e.g., a p-channel transistor), so that the n-channel type transistor may be desirable for a large-scale display device.

That is, electrons have higher mobility than that of holes. Since the n-channel type transistor uses electrons as a carrier, a response speed to the control signal of the n-channel type transistor is higher than that of the p-channel type transistor that uses holes as the carrier.

When each of the first through fourth transistors T1, T2, T3 and T4 is implemented with an oxide TFT, an active layer of each of the first through fourth transistors T1, T2, T3 and T4 may include an oxide semiconductor.

The oxide semiconductor may be an oxide including at least one selected from titanium (Ti), hafnium (Hf), zirconium (Zr), aluminum (Al), tantalum (Ta), germanium (Ge), zinc (Zn), gallium (Ga), Tin (Sn), and indium (In).

For example, the oxide semiconductor may include at least one selected from an indium-gallium-zinc-oxide (In—Ga—Zn—O), an indium-zinc-oxide (In—Zn—O), a zinc-tin-oxide (Zn—Sn—O), an indium-gallium oxide (In—Ga—O), an indium-tin-oxide (In—Sn—O), an indium-zirconium-oxide (In—Zr—O), an indium-zirconium-zinc-oxide (In—Zr—Zn—O), an indium-zirconium-tin-oxide (In—Zr—Sn—O), an indium-zirconium-gallium-oxide (In—Zr—Ga—O), an indium-aluminum-oxide (In—Al—O), an indium-zinc-aluminum-oxide (In—Zn—Al—O), an indium-tin-aluminum-oxide (In—Sn—Al—O), an indium-aluminum-gallium-oxide (In—Al—Ga—O), an indium-tantalum-oxide (In—Ta—O), an indium-tantalum-zinc-oxide (In—Ta—Zn—O), an indium-tantalum-tin-oxide (In—Ta—Sn—O), an indium-tantalum-gallium-oxide (In—Ta—Ga—O), an indium-germanium-oxide (In—Ge—O), an indium-germanium-zinc-oxide (In—Ge—Zn—O), an indium-germanium-tin-oxide (In—Ge—Sn—O), an indium-germanium-gallium-oxide (In—Ge—Ga—O), a titanium-indium-zinc-oxide (Ti—In—Zn—O), and a hafnium-indium-zinc-oxide (Hf—In—Zn—O).

The above-described oxide semiconductors are just examples, and the present invention is not limited thereto. For example, any suitable oxide semiconductor may be used.

The capacitor Cst may be connected between the first node N1 and the second node N2.

For example, a first electrode of the capacitor Cst may be connected to the first node N1, and a second electrode of the capacitor Cst may be connected to the second node N2.

The OLED may be connected between the second node N2 and a second power source ELVSS.

For example, an anode electrode of the OLED may be connected to the second node N2, and a cathode electrode of the OLED may be connected to the second power source ELVSS.

The OLED may receive the driving current from the second transistor T2, and may emit light having a brightness corresponding to the driving current.

In addition, as indicated by a dotted line, a parasitic capacitor Cp may be present in the OLED.

The first node N1 may be a node to which the first transistor T1, the second transistor T2, the third transistor T3, and the capacitor Cst are commonly connected.

For example, the second electrode of the first transistor T1, the gate electrode of the second transistor T2, the first electrode of the third transistor T3, and the first electrode of the capacitor Cst may be commonly connected to the first node N1.

The second node N2 may be a node to which the second transistor T2, the fourth transistor T4, the capacitor Cst, and the OLED are commonly connected.

For example, the second electrode of the second transistor T2, the first electrode of the fourth transistor T4, the second electrode of the capacitor Cst, and the anode electrode of the OLED may be commonly connected to the second node N2.

The first power source ELVDD may be a high electric potential power source, and the second power source ELVSS may be a low electric potential power source.

For example, the first power source ELVDD may have a positive voltage, and the second power source ELVSS may have a negative voltage or a ground voltage.

In addition, each of the reference power source REF and the initialization power source INT may have a voltage level that is different from or equal to that of the second power source ELVSS.

Figure 2:
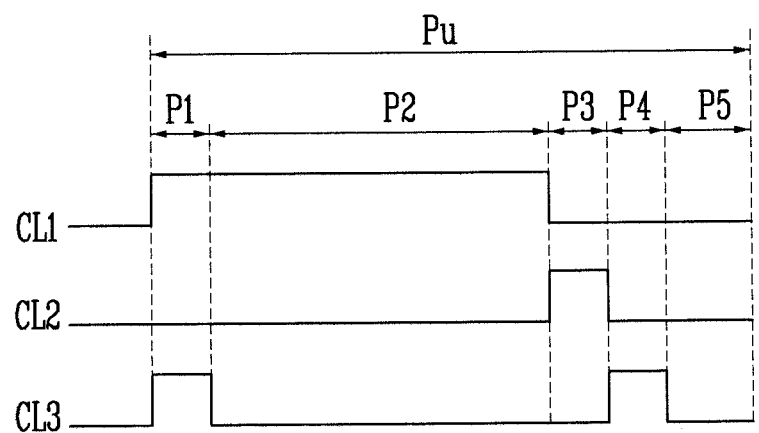
FIG. 2 is a waveform diagram illustrating a method of driving a pixel, according to an exemplary embodiment of the present invention.

FIG. 2 is a waveform diagram illustrating a method of driving a pixel, according to an exemplary embodiment of the present invention.

For convenience, an operation of driving the pixel PXL1 during a unit period Pu will be described with reference to FIGS. 1 and 2.

Referring to FIG. 2, the method of driving the pixel PXL1 according to an exemplary embodiment of the present invention may include a first initialization operation, a threshold voltage compensation operation, a data writing operation, a second initialization operation, and an emission operation.

The first initialization operation may be performed during a first period P1. During the first initialization operation, the third transistor T3 may be turned on to supply a voltage of the reference power source REF (hereinafter, referred to as a reference voltage) to the first node N1, and the fourth transistor T4 may be turned on to supply a voltage of the initialization power source INT (hereinafter, referred to as an initialization voltage) to the second node N2.

Thus, during the first initialization operation, the reference voltage may be supplied to the gate electrode of the second transistor T2, and the initialization voltage may be supplied to the second electrode of the second transistor T2, for example, the source electrode.

To this end, during the first period P1, a control signal, for example, a signal having a high level, may be supplied to the first control line CL1 and the third control line CL3.

Thus, during the first period P1, the third transistor T3 and the fourth transistor T4 may be maintained in an on state, and the first transistor T1 may be maintained in an off state.

Since the OLED needs to be maintained or substantially maintained at a non-emission state during the first period P1, the initialization voltage may have a voltage level at which the OLED may be set to be in the non-emission state.

For example, the initialization voltage may have a voltage level that is equal to or less than a voltage value obtained by adding a threshold voltage of the OLED to the voltage of the second power source ELVSS. For example, the initialization voltage may have a voltage level that is equal to or less than that of the second power source ELVSS.

Through the above-described initialization operation, the pixel PXL1 may be initialized to not be affected by the previous unit period.

The threshold voltage compensation operation may be performed during a second period P2. During the threshold voltage compensation operation, an on state of the third transistor T3 may be maintained so that the threshold voltage of the second transistor T2 may be stored in the capacitor Cst.

To this end, during the second period P2, the control signal may be supplied to the first control line CL1.

Thus, during the second period P2, the third transistor T3 may be maintained in an on state, and the first transistor T1 and the fourth transistor T4 may be in an off state.

During the second period P2, the voltage of the first node N1 may be maintained or substantially maintained at the reference voltage, and the voltage of the second node N2 may be changed from the initialization voltage to a voltage value obtained by subtracting the threshold voltage of the second transistor T2 from the reference voltage.

That is, through a source-follower operation, the voltage VN2 of the second node N2 is changed to a value obtained using the following equation 1:

$$VN2 = Vref - Vth \quad (1)$$

where VN2 is the voltage of the second node N2, Vref is a reference voltage, and Vth is a threshold voltage of the second transistor T2.

Since the capacitor Cst stores a voltage corresponding to a difference between the voltage of the first node N1 and the voltage of the second node N2, the capacitor Cst may store the threshold voltage of the second transistor T2.

In order to maintain the OLED in the non-emission state during the threshold voltage compensation operation, the voltage of the second node N2 may have a voltage level at which the OLED may be maintained in the non-emission state.

A time for performing the threshold voltage compensation operation is determined by the control signal supplied to the first control line CL1.

Thus, a width of the control signal supplied to the first control line CL1 is adjusted, so that the time for performing the threshold voltage compensation operation may be adjusted. Thus, the pixel PXL1 according to an exemplary embodiment of the present invention may be applied to a large-scale display device, where a time for performing the threshold voltage compensation operation is short.

A data writing operation may be performed during a third period P3. During the data writing operation, the first transistor T1 may be turned on to supply a data signal to the first node N1.

Thus, during the data writing operation, the data signal transmitted from the data line DL may be supplied to the gate electrode of the second transistor T2.

To this end, during the third period P3, a control signal, for example, a signal having a high level, may be supplied to the second control line CL2.

Thus, during the third period P3, the first transistor T1 may be turned on, and the third transistor T3 and the fourth transistor T4 may be maintained in an off state.

During the third period P3, the voltage of the first node N1 may be maintained or substantially maintained at a voltage of the data signal (hereinafter, referred to as a data voltage), and during the third period P3, the voltage VN2 of the second node N2 may be changed to a value obtained using the following equation 2:

$$VN2 = Vref - Vth + \frac{Cst1}{(Cst1 + Cp1)}(Vdata - Vref) \quad (2)$$

where VN2 is a voltage of the second node N2, Vref is a reference voltage, Vth is a threshold voltage of the second transistor T2, Cst1 is a capacity of the capacitor Cst, Cp1 is a capacity of the parasitic capacitor Cp, and Vdata is a data voltage.

Since the capacitor Cst stores a voltage corresponding to a difference between the voltage of the first node N1 and the voltage of the second node N2, the capacitor Cst may store a voltage obtained using the following equations (3) and (4):

$$Vgs = VN1 - VN2 \quad (3)$$

-continued $$Vgs = Vdata - \left[Vref - Vth + \frac{Cst1}{(Cst1 + Cp1)}(Vdata - Vref)\right] \quad (4)$$

where Vgs is a voltage stored in the capacitor Cst, VN1 is a voltage of the first node N1, VN2 is a voltage of the second node N2, Vref is a reference voltage, Vth is a threshold voltage of the second transistor T2, Cst1 is a capacity of the capacitor Cst, Cp1 is a capacity of the parasitic capacitor Cp, and Vdata is a data voltage.

When a plurality of pixels PXL1 according to an exemplary embodiment of the present invention are included, the second transistors T2 included in the plurality of pixels PXL1 may have different threshold voltages from each other due to a manufacturing process.

Thus, voltages of the second nodes N2 of the plurality of pixels PXL1 may be differently set. Thus a difference between emission times of the plurality of pixels PXL1 may occur.

Accordingly, in the method of driving the pixel PXL1 according to an exemplary embodiment of the present invention, a second initialization operation may be performed, so that the voltages of the second nodes N2 of the plurality of pixels PXL1 may be equally or substantially equally initialized, and an emission time difference that may occur due to the difference between threshold voltages of the second transistors T2 may be eliminated or reduced.

The second initialization operation may be performed during a fourth period P4. During the second initialization operation, the fourth transistor T4 may be turned on to again supply (e.g., to supply a second time) the initialization voltage to the second node N2.

Thus, during the second initialization operation, the initialization voltage may be supplied to the second electrode of the second transistor T2.

To this end, during the fourth period P4, the control signal may be supplied again to the third control line CL3.

Thus, during the fourth period P4, the fourth transistor T4 may be turned on, and the first transistor T1 and the third transistor T3 may be in an off state.

Since the initialization voltage may be set to have a voltage level at which the OLED may be maintained or substantially maintained in a non-emission state, during the fourth period P4, the OLED may be maintained or substantially maintained in the non-emission state.

In addition, the driving currents transmitted from the second transistors T2 may flow to the initialization power source INT via the fourth transistors T4.

When the initialization voltage is supplied to the second node N2, the voltage of the first node N1 is changed together through a coupling operation of the capacitor Cst, so that during the data writing operation, the voltage stored in the capacitor Cst may be maintained or substantially maintained without any change.

The emission operation may be performed during a fifth period P5. During the emission operation, the driving current corresponding to the voltage stored in the capacitor Cst may be supplied from the second transistor T2 to the OLED.

To this end, during the fifth period P5, control signals are not supplied to the control lines CL1, CL2, and CL3, respectively.

Thus, during the fifth period P5, the first transistor T1, the third transistor T3, and the fourth transistor T4 may be in an off state.

During the fifth period P5, the second transistor T2 may supply a driving current to the OLED obtained using the following equations (5) and (6):

$$Io = k(Vgs - Vth)^2 \quad (5)$$

$$Io = k\left(\frac{Cp1}{(Cst1 + Cp1)}\right)^2 (Vdata - Vref)^2 \quad (6)$$

where Io is a driving current output from the second transistor T2, k is a constant, Vgs is a voltage stored in the capacitor Cst, Vth is a threshold voltage of the second transistor T2, Cst1 is a capacity of the capacitor Cst, Cp1 is a capacity of the parasitic capacitor Cp, Vdata is a data voltage, and Vref is a reference voltage.

Thus, the OLED may emit light having a brightness corresponding to the driving current Io during the fifth period P5.

In this case, the driving current output from the second transistor T2 is determined regardless of the threshold voltage Vth. Thus, a brightness non-uniformity phenomenon caused by the difference between threshold voltages of the driving transistors T2 included in the pixels PXL1 may be eliminated or reduced.

Figure 3:
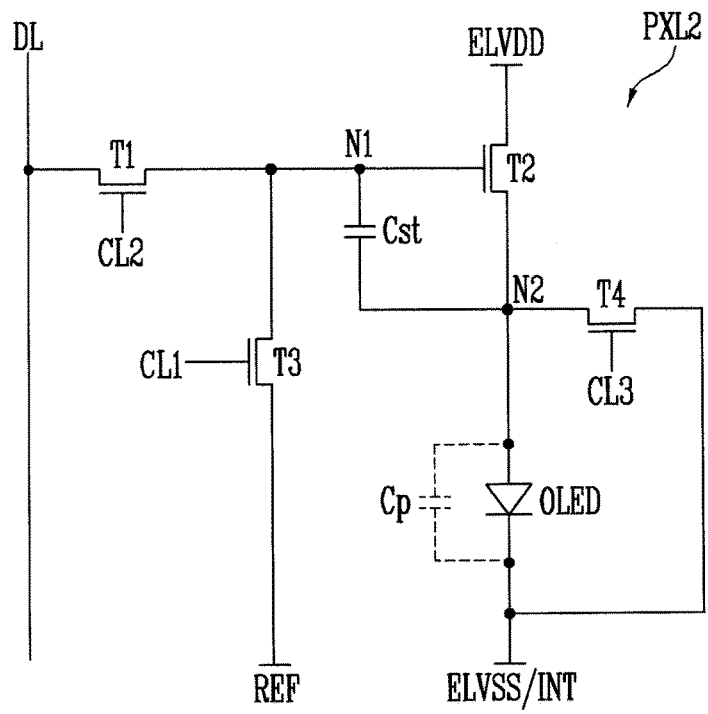
FIG. 3 illustrates a pixel according to another exemplary embodiment of the present invention.

FIG. 3 illustrates a pixel according to another exemplary embodiment of the present invention. Here, a difference between the above-described embodiment and the embodiment illustrated in FIG. 3 will be described, and thus, repeat description of the same or substantially the same elements and components may be omitted.

Referring to FIG. 3, the initialization power source INT may have a voltage level that is equal to or substantially equal to that of the second power source ELVSS.

For example, the initialization power source INT may be implemented with the same power source as the second power source ELVSS.

Thus, in a pixel PXL2 according to another exemplary embodiment of the present invention, the fourth transistor T4 may be connected between the second node N2 and the second power source ELVSS.

For example, a first electrode of the fourth transistor T4 may be connected to the second node N2, a second electrode of the fourth transistor T4 may be connected to the second power source ELVSS, and a gate electrode of the fourth transistor T4 may be connected to the third control line CL3.

The pixel PXL2 includes a smaller number of power supplies than the number of power supplies in the pixel PXL1 illustrated in FIG. 1, so that manufacturing conveniences and reduction in manufacturing costs may be achieved.

Figure 4:
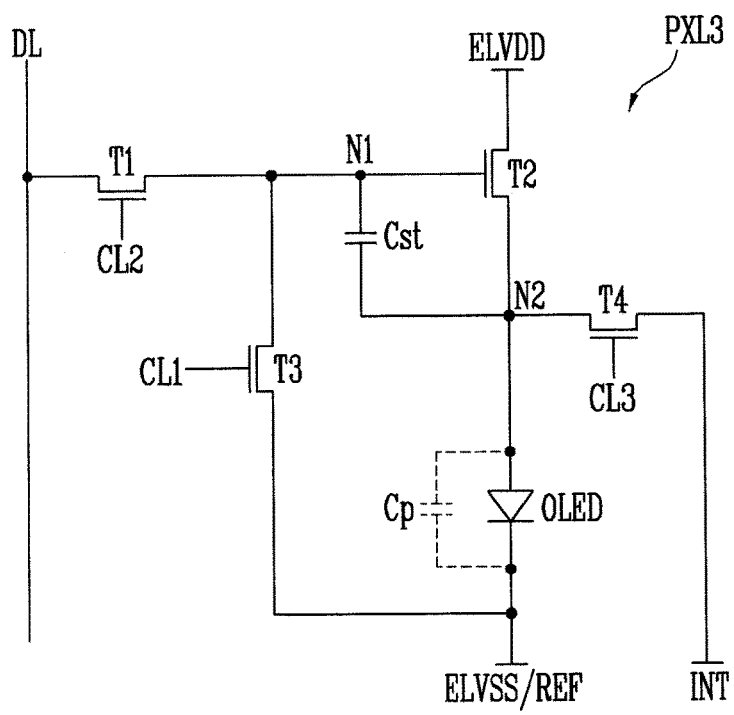
FIG. 4 illustrates a pixel according to another exemplary embodiment of the present invention.

FIG. 4 illustrates a pixel according to another exemplary embodiment of the present invention. Here, a difference between the above-described embodiments and the embodiment shown in FIG. 4 will be described, and thus, repeat description of the same or substantially the same elements and components may be omitted.

Referring to FIG. 4, the reference power source REF may have a voltage level that is equal to or substantially equal to that of the second power source ELVSS.

For example, the reference power source REF may be implemented with the same power source as the second power source ELVSS.

Thus, in a pixel PXL3 according to another exemplary embodiment of the present invention, the third transistor T3 may be connected between the first node N1 and the second power source ELVSS.

For example, a first electrode of the third transistor T3 may be connected to the first node N1, a second electrode of the third transistor T3 may be connected to the second power source ELVSS, and a gate electrode of the third transistor T3 may be connected to the first control line CL1.

The pixel PXL3 may be driven on a condition in which the threshold voltage of the driving transistor T2 is negative-shifted, and includes a smaller number of power supplies than in the pixel PXL1 illustrated in FIG. 1, so that manufacturing conveniences and a reduction in manufacturing costs may be achieved.

However, the present invention is not limited to the pixels PXL1, PXL2, and PXL3 shown in FIGS. 1, 3, and 4, respectively, and according to another embodiment of the present invention, in order to minimize or further reduce the number of power supplies, the second power source ELVSS, the initialization power source INT, and the reference power source REF may include the same or substantially the same voltage level.

For example, the second power source ELVSS, the initialization power source INT, and the reference power source REF may be implemented as the same power source.

In this case, the third transistor T3 may be connected between the first node N1 and the second power source ELVSS, and the fourth transistor T4 may be connected between the second node N2 and the second power source ELVSS.

Figure 5:
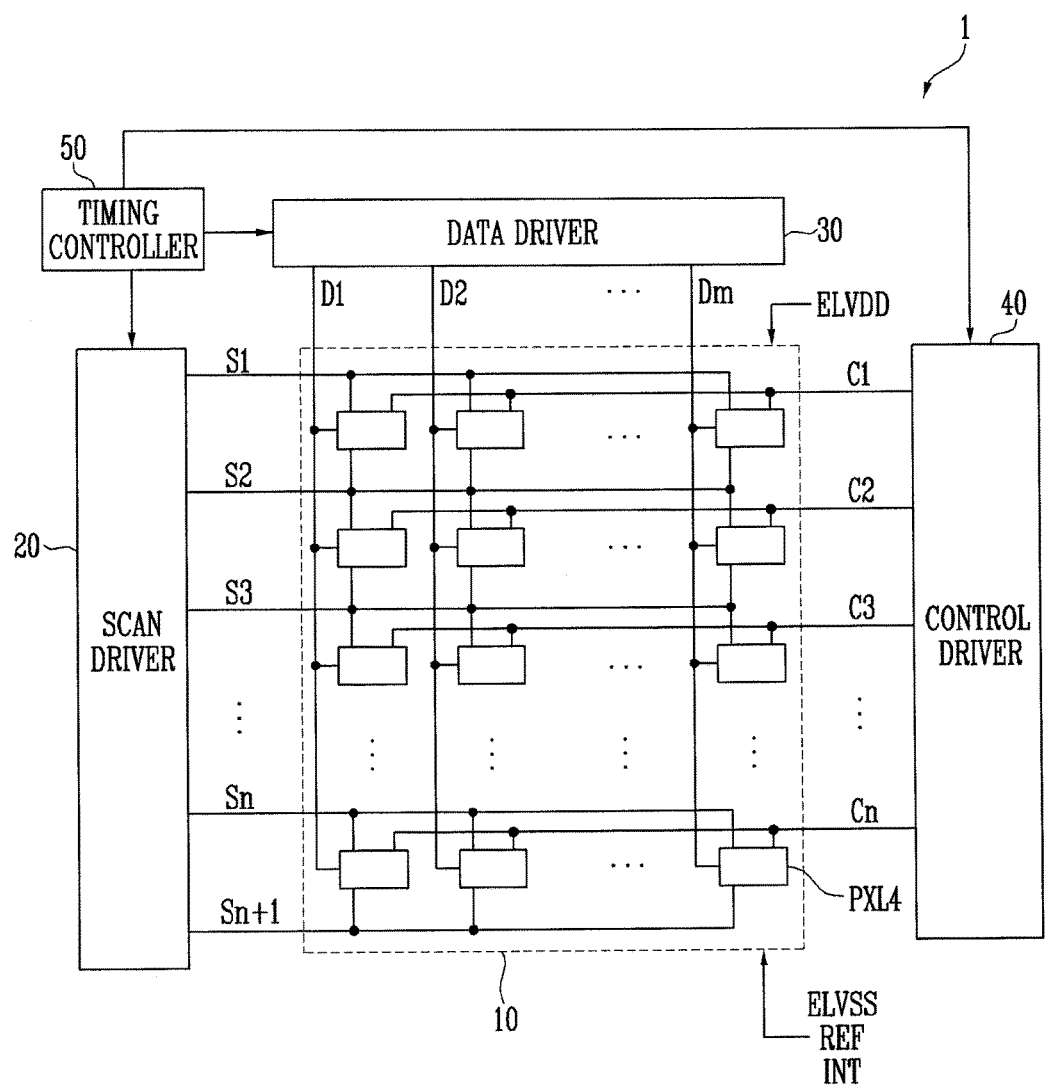
FIG. 5 illustrates an organic light-emitting display device according to an exemplary embodiment of the present invention.
Figure 6:
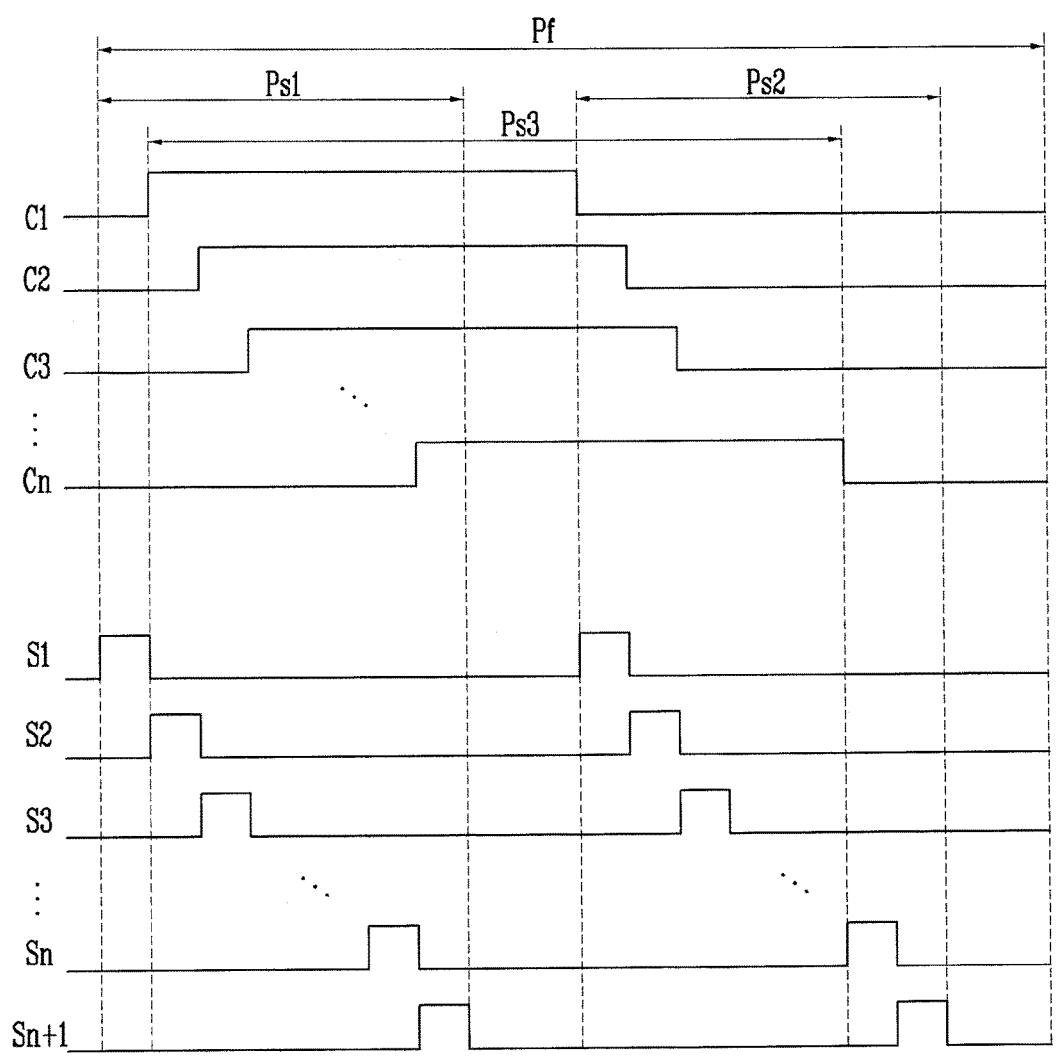
FIG. 6 is a waveform diagram illustrating operations of a scan driver and a control driver according to an exemplary embodiment of the present invention.

FIG. 5 illustrates an organic light-emitting display device according to an exemplary embodiment of the present invention, and FIG. 6 is a waveform diagram illustrating operations of a scan driver and a control driver according to an exemplary embodiment of the present invention.

Referring to FIG. 5, an organic light-emitting display device 1 according to an exemplary embodiment of the present invention may include a pixel unit (e.g., a pixel area) 10 including a plurality of pixels PXL4, a scan driver 20, a data driver 30, a control driver 40, and a timing controller 50.

In addition, the organic light-emitting display device 1 according to an exemplary embodiment of the present disclosure may further include (n+1) scan lines S1 through Sn+1 connected between the scan driver 20 and the pixels PXL4, m data lines D1 through Dm connected between the data driver 30 and the pixels PXL4, and n control lines C1 through Cn connected between the control driver 40 and the pixels PXL4 (where n and m are natural numbers that are equal to or greater than 2).

The pixels PXL4 may be connected to the (n+1) scan lines S1 through Sn+1, the m data lines D1 through Dm, and the n control lines C1 through Cn.

For example, each of the pixels PXL4 may be connected to one data line, one control line, and two scan lines.

That is, the pixels PXL4 arranged at an h-th line (e.g., and h-th horizontal line) may be connected to an h-th scan line Sh, an (h+1)-th scan line Sh+1, and a h-th control line Ch (where h is a natural number that is equal to or less than n.).

The pixels PXL4 may receive the first power source ELVDD, the second power source ELVSS, the reference power source REF, and the initialization power source INT from a power supply unit.

In addition, each of the pixels PXL4 may generate light corresponding to a data signal, due to a current flowing to the second power source ELVSS from the first power source ELVDD via the OLED.

The scan driver 20 may generate scan signals through control of the timing controller 50, and may supply the generated scan signals to the scan lines S1 through Sn+1.

Thus, the pixels PXL4 may receive the scan signals through the scan lines S1 through Sn+1.

Referring to FIG. 6, the scan driver 20 according to an exemplary embodiment of the present invention may supply corresponding scan signals to each of the scan lines S1 through Sn+1 two times during one frame period Pf.

For example, the scan driver 20 may sequentially supply first scan signals to the scan lines S1 through Sn+1 during a first sub-period Ps1, and may sequentially supply second scan signals to the scan lines S1 through Sn+1 during a second sub-period Ps2.

The data driver 30 may generate data signals through control of the timing controller 50, and may supply the generated data signals to the data lines D1 through Dm.

Thus, the pixels PXL4 may receive the data signals from the data lines D1 through Dm.

The control driver 40 may generate control signals through control of the timing controller 50, and may supply the generated control signals to the control lines C1 through Cn.

Thus, the pixels PXL4 may receive the control signals from the control lines C1 through Cn.

Referring to FIG. 6, the control driver 40 according to an exemplary embodiment of the present invention may supply control signals to the control lines C1 through Cn during a third sub-period Ps3 included in the one frame period Pf.

In FIG. 5, for convenience of illustration, elements of the scan driver 20, the data driver 30, the control driver 40, and the timing controller 50 are separately illustrated. However, the present invention is not limited thereto, and at least a part of the elements may be integrated together.

Figure 7:
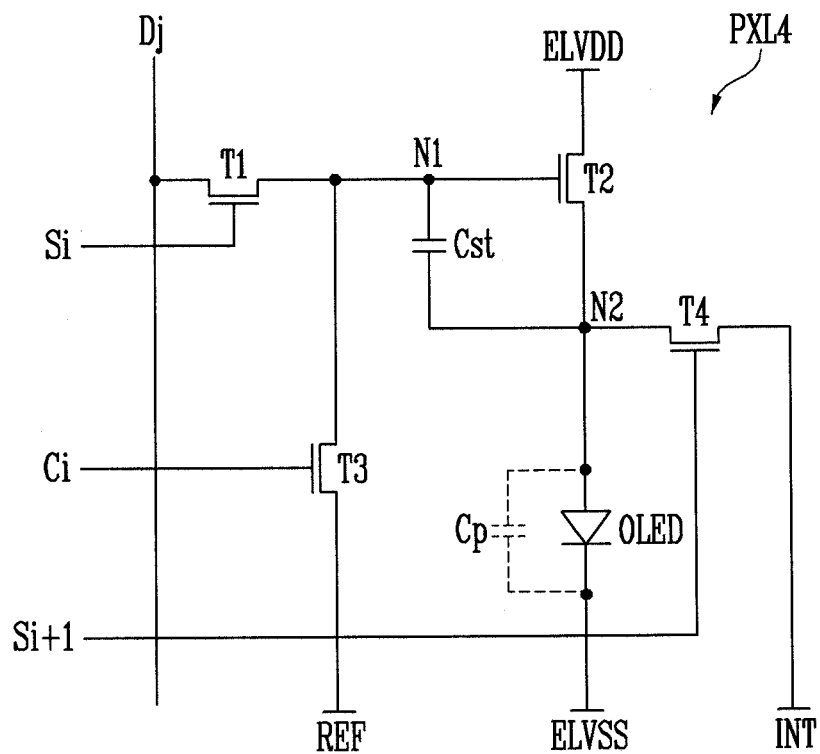
FIG. 7 illustrates an exemplary embodiment of a pixel illustrated in FIG. 5.

FIG. 7 illustrates an exemplary embodiment of a pixel illustrated in FIG. 5. In particular, in FIG. 7, for convenience of illustration, the pixel PXL4 connected to an i-th scan line Si, an (i+1)-th scan line Si+1, a j-th data line Dj, and an i-th control line Ci is shown (where i is a natural number that is equal to or less than n, and j is a natural number that is equal to or less than m.).

Referring to FIG. 7, each of the pixels PXL4 according to another exemplary embodiment of the present invention may include a first transistor T1, a second transistor T2, a third transistor T3, a fourth transistor T4, a capacitor Cst, and an OLED.

However, the pixel PXL4 illustrated in FIG. 7 is different from the pixel PXL1 illustrated in FIG. 1, in that the gate electrode of the first transistor T1 is connected to the i-th scan line Si, the gate electrode of the third transistor T3 is connected to the i-th control line Ci, and the gate electrode of the fourth transistor T4 is connected to the (i+1)-th scan line Si+1.

Since the pixel PXL1 illustrated in FIG. 1 is connected to three control lines CL1, CL2, and CL3, three driving units (e.g., drivers) for supplying control signals to the control lines CL1, CL2, and CL3 are used to drive the pixel PXL1.

However, since the pixel PXL4 illustrated in FIG. 7 uses two scan lines Si and Si+1 and one control line Ci, the pixel PXL4 may be driven using only two driving units or drivers (e.g., the scan driver 20 and the control driver 40).

The above-described contents relating to FIGS. 1, 3, and 4 may also be applied to the pixel PXL4 of FIG. 7. Here, repeat description of the above contents will be omitted.

Figure 8:
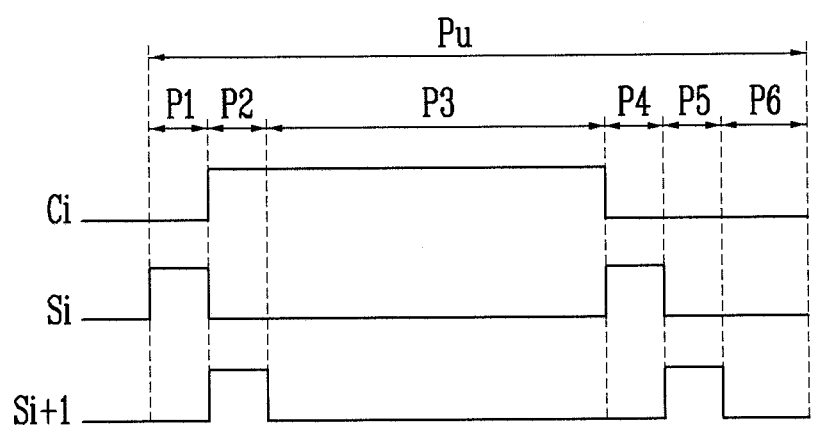
FIG. 8 is a waveform diagram illustrating a method of driving the pixel illustrated in FIG. 7.

FIG. 8 is a waveform diagram illustrating a method of driving the pixel illustrated in FIG. 7.

An operation of driving the pixel PXL4 during the unit period Pu will be described with reference to FIGS. 7 and 8.

Referring to FIG. 8, the method of driving the pixel PXL4 according to another exemplary embodiment of the present invention may further include an initial driving operation compared to the embodiment described with reference to FIG. 2.

The initial driving operation is additionally performed when the gate electrode of the first transistor T1 is connected to the i-th scan line Si.

That is, the method of driving the pixel PXL4 according to another exemplary embodiment of the present invention may include an initial driving operation, a first initialization operation, a threshold voltage compensation operation, a data writing operation, a second initialization operation, and an emission operation.

The initial driving operation may be performed during a first period P1 preceding the first period P1 shown in FIG. 2. During the initial driving operation, a first scan signal (e.g., an i-th scan signal), for example, a scan signal having a high level, may be supplied to the i-th scan line Si.

Thus, during the first period P1, the first transistor T1 may be turned on, and the third transistor T3 and the fourth transistor T4 may be maintained in an off state.

The first initialization operation may be performed during a second period P2. During the first initialization operation, a control signal, for example, a signal having a high level, may be supplied to the i-th control line Ci, a first scan signal (e.g., an (i+1)-th scan signal), for example, a scan signal having a high level, may be supplied to the (i+1)-th scan line Si+1, and the first scan signal supplied to the i-th scan line may be stopped (e.g., changed to a low level).

Thus, during the second period P2, the third transistor T3 and the fourth transistor T4 may be in an on state, and the first transistor T1 may be turned off.

As a result, during the first initialization operation, the reference voltage and the initialization voltage may be supplied to the first node N1 and the second node N2 of the pixel PXL4, respectively.

The threshold voltage compensation operation may be performed during a third period P3. During the threshold voltage compensation operation, the control signal may be supplied to (or maintained on) the i-th control line Ci, and the first scan signal supplied to the (i+1)-th scan line Si+1 may be stopped (e.g., changed to a low level).

Thus, during the third period P3, the third transistor T3 may be maintained in an on state, and the first transistor T1 and the fourth transistor T4 may be in an off state.

During the third period P3, the voltage of the first node N1 may be maintained or substantially maintained as the reference voltage, and the voltage of the second node N2 may be changed from the initialization voltage to a value obtained by subtracting a threshold voltage of the second transistor T2 from the reference voltage.

That is, the voltage of the second node N2 is changed to a value obtained using the above-described equation 1.

Since the capacitor Cst stores a voltage corresponding to a difference between the voltage of the first node N1 and the voltage of the second node N2, the capacitor Cst may store the threshold voltage of the second transistor T2.

The data writing operation may be performed during a fourth period P4. During the data writing operation, a second scan signal (e.g., an i-th scan signal), for example, a scan signal having a high level, may be supplied to the i-th scan line. Si.

Thus, during the fourth period P4, the first transistor T1 may be turned on, and the third transistor T3 and the fourth transistor T4 may be in an off state.

As a result, during the fourth period P4, the voltage of the first node N1 is maintained or substantially maintained as a data voltage transmitted from the j-th data line Dj, and the voltage of the second node N2 is changed to a value obtained using the above-described equation 2.

In addition, the capacitor Cst may store a voltage obtained using the above-described equations 3 and 4.

The second initialization operation may be performed during a fifth period P5. During the second initialization operation, a second scan signal (e.g., an (i+1)-th scan signal), for example, a scan signal having a high level, may be supplied to the (i+1)-th scan line Si+1.

Thus, during the fifth period P5, the fourth transistor T4 may be turned on, and the first transistor T1 and the third transistor T3 may be in an off state.

As a result, during the second initialization operation, the initialization voltage may be supplied to the second node N2.

The emission operation may be performed during a sixth period P6. During the emission operation, a scan signal is not supplied to the i-th scan line Si and the (i+1)-th scan line Si+1, and a control signal is not supplied to the i-th control line Ci.

Thus, during the sixth period P6, the first transistor T1, the third transistor T3, and the fourth transistor T4 may be in an off state.

As a result, during the emission operation, the second transistor T2 may supply a driving current to the OLED obtained using the above-described equations 5 and 6. Thus, the OLED may emit light having a brightness corresponding to the driving current during the emission operation.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Example embodiments have been disclosed herein, and although specific terms are employed, they are used and are to be interpreted in a generic and descriptive sense only, and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present invention as set forth in the following claims, and their equivalents.

What is claimed is:

1. A pixel comprising:
a first transistor connected between a data line and a first node;
a second transistor connected between a first power source and a second node, the second transistor comprising a gate electrode connected to the first node;
a third transistor connected between the first node and a third power source;
a fourth transistor connected between the second node and an fourth power source;
a capacitor connected between the first node and the second node; and
an organic light-emitting diode (OLED) connected between the second node and a second power source,
wherein the third transistor is configured to be in an on state during a first initialization operation, the third transistor is configured to be in an off state during a second initialization operation, and the fourth transistor is configured to be in an on state during the first initialization operation and the second initialization operation.

2. The pixel of claim 1, wherein:
the first transistor comprises a first electrode connected to the data line, a second electrode connected to the first node, and a gate electrode connected to a second control line;
the second transistor further comprises a first electrode connected to the first power source, and a second electrode connected to the second node;
the third transistor comprises a first electrode connected to the first node, a second electrode connected to the third power source, and a gate electrode connected to a first control line; and
the fourth transistor comprises a first electrode connected to the second node, a second electrode connected to the fourth power source, and a gate electrode connected to a third control line.

3. The pixel of claim 1, wherein each of the first through fourth transistors comprises an n-channel transistor.

4. The pixel of claim 1, wherein the third transistor is configured to be in an on state during a first period and a second period, and the fourth transistor is configured to be in an on state during the first period.

5. The pixel of claim 4, wherein the first transistor is configured to be in an on state during a third period, and the fourth transistor is further configured to be in an on state during a fourth period.

6. The pixel of claim 1, wherein the fourth power source is configured to be at a same voltage level as that of the second power source.

7. The pixel of claim 1, wherein the third power source is configured to be at a same voltage level as that of the second power source.

8. The pixel of claim 1, wherein an active layer of each of the first through fourth transistors comprises an oxide semiconductor.

9. A method of driving a pixel comprising a first transistor, a second transistor, a third transistor, a fourth transistor, a capacitor, and an organic light-emitting diode (OLED), the method comprising:
  a first initialization operation of supplying a reference voltage to a gate electrode of the second transistor by turning on the third transistor, and supplying an initialization voltage to a source electrode of the second transistor by turning on the fourth transistor;
  a threshold voltage compensation operation of maintaining the third transistor in an on state, and storing a threshold voltage of the second transistor in the capacitor;
  a data writing operation of supplying a data voltage to the gate electrode of the second transistor by turning on the first transistor;
  a second initialization operation of supplying the initialization voltage to the source electrode of the second transistor by turning on the fourth transistor, wherein the third transistor is in an off state during the second initialization operation; and
  an emission operation of supplying a driving current from the second transistor to the OLED corresponding to a voltage stored in the capacitor.

10. The method of claim 9, wherein the first transistor is in an off state during the first initialization operation, the threshold voltage compensation operation, the second initialization operation, and the emission operation.

11. The method of claim 9, wherein the third transistor is in an off state during the data writing operation and the emission operation.

12. The method of claim 9, wherein the fourth transistor is in an off state during the threshold voltage compensation operation, the data writing operation, and the emission operation.

13. An organic light-emitting display device comprising:
  a plurality of pixels connected to (n+1) (where n is a natural number that is equal to or greater than 2) scan lines, m (where m is a natural number that is equal to or greater than 2) data lines, and n control lines;
  a scan driver configured to supply scan signals to the scan lines;
  a data driver configured to supply data signals to the data lines; and
  a control driver configured to supply control signals to the control lines,
  wherein one of the plurality of pixels is connected to an i-th (where i is a natural number that is equal to or less than n) scan line, an (i+1)-th scan line, an i-th control line, and a j-th (where j is a natural number that is equal to or less than m) data line, and the one pixel comprises:
    a first transistor connected between the j-th data line and a first node, the first transistor being configured to be turned on when an i-th scan signal is supplied to the i-th scan line;
    a second transistor connected between a first power source and a second node, the second transistor comprising a gate electrode connected to the first node;
    a third transistor connected between the first node and a third power source, the third transistor being configured to be turned on when a control signal is supplied to the i-th control line;
    a fourth transistor connected between the second node and an fourth power source, the fourth transistor being configured to be turned on when an (i−1)-th scan signal is supplied to the (i+1)-th scan line;
    a capacitor connected between the first node and the second node; and
    an organic light-emitting diode (OLED) connected between the second node and a second power source
  wherein the i-th scan signal is supplied to the i-th scan line during a first period and a fourth period, the (i+1)-th scan signal is supplied to the (i+1)-th scan line during a second period and a fifth period, and the control signal is supplied to the i-th control line during the second period and a third period.

14. The organic light-emitting display device of claim 13, wherein:
  the first transistor comprises a first electrode connected to the j-th data line, a second electrode connected to the first node, and a gate electrode connected to the i-th scan line;
  the second transistor further comprises a first electrode connected to the first power source, and a second electrode connected to the second node;
  the third transistor comprises a first electrode connected to the first node, a second electrode connected to the third power source, and a gate electrode connected to the i-th control line; and
  the fourth transistor comprises a first electrode connected to the second node, a second electrode connected to the fourth power source, and a gate electrode connected to the (i+1)-th scan line.

15. The organic light-emitting display device of claim 13, wherein each of the first through fourth transistors comprises an n-channel transistor.

16. The organic light-emitting display device of claim 13, wherein the OLED is configured to emit light during a sixth period.

17. The organic light-emitting display device of claim 13, wherein the fourth power source is configured to be at a same voltage level as that of the second power source.

18. The organic light-emitting display device of claim 13, wherein the third power source is configured to be at a same voltage level as that of the second power source.

19. The organic light-emitting display device of claim 13, wherein an active layer of each of the first through fourth transistors comprises an oxide semiconductor.

* * * * *